United States Patent [19]
Hsu

[11] Patent Number: 5,455,190
[45] Date of Patent: Oct. 3, 1995

[54] METHOD OF MAKING A VERTICAL CHANNEL DEVICE USING BURIED SOURCE TECHNIQUES

[75] Inventor: Chen-Chung Hsu, Taichung, Taiwan, Prov. of China

[73] Assignee: United Microelectronics Corporation, Hsinchu, Taiwan, Prov. of China

[21] Appl. No.: 351,492

[22] Filed: Dec. 7, 1994

[51] Int. Cl.⁶ .................................................. H01L 21/266
[52] U.S. Cl. ............................ 437/40; 437/38; 437/203
[58] Field of Search .................................. 437/26, 38, 40, 437/192, 203; 148/DIG. 50

[56] References Cited

U.S. PATENT DOCUMENTS

| | | | |
|---|---|---|---|
| 5,032,529 | 7/1991 | Beitman et al. | 437/40 |
| 5,077,228 | 12/1991 | Eklund et al. | 437/203 |
| 5,164,325 | 11/1992 | Cogan et al. | 437/29 |
| 5,283,201 | 2/1994 | Tsang et al. | 437/40 |
| 5,385,852 | 1/1995 | Oppermann et al. | 437/40 |

*Primary Examiner*—Chandra Chaudhari
*Attorney, Agent, or Firm*—George O. Saile; Rosemary L. S. Pike

[57] ABSTRACT

A new method of manufacturing a vertical channel device integrated circuit is described. A structure is provided comprising a semiconductor substrate having a first conductivity type, a buried source region having a second opposite conductivity type, and an epitaxial layer of the second conductivity type having a lower dopant concentration than the buried source region. Field oxide regions are formed at outer edges of the epitaxial layer. A well region of first conductivity type is implanted into the central portion of the epitaxial layer to define the active area. Trenches are etched through the well region into the buried source region. A first layer of silicon oxide is grown on the surface and within the trenches. Gate electrodes are formed by depositing a layer of polysilicon and etching back to leave the polysilicon layer only within the trenches. Ions of second conductivity type are implanted into the top portion of the well region to form drain regions. A second layer of silicon oxide is deposited over the top surfaces and planarized. Contact trenches are etched through the second silicon oxide layer and the field oxide regions to connect to the buried source region. A second set of contact trenches are etched through portions of the second silicon oxide layer to the underlying drain regions. A layer of tungsten is deposited and etched back leaving the tungsten within the first and second trenches. Interconnections are made between the source and drain regions to complete the fabrication.

44 Claims, 6 Drawing Sheets

METHOD OF MAKING A VERTICAL CHANNEL DEVICE USING BURIED SOURCE TECHNIQUES

BACKGROUND OF THE INVENTION (1) Field of the Invention

The present invention relates to the fabrication of integrated circuit devices, and more particularly, to a method of making a vertical channel device using buried source techniques to reduce the area of the active region in the fabrication of integrated circuits.

(2) Description of the Prior Art

Figure 1:
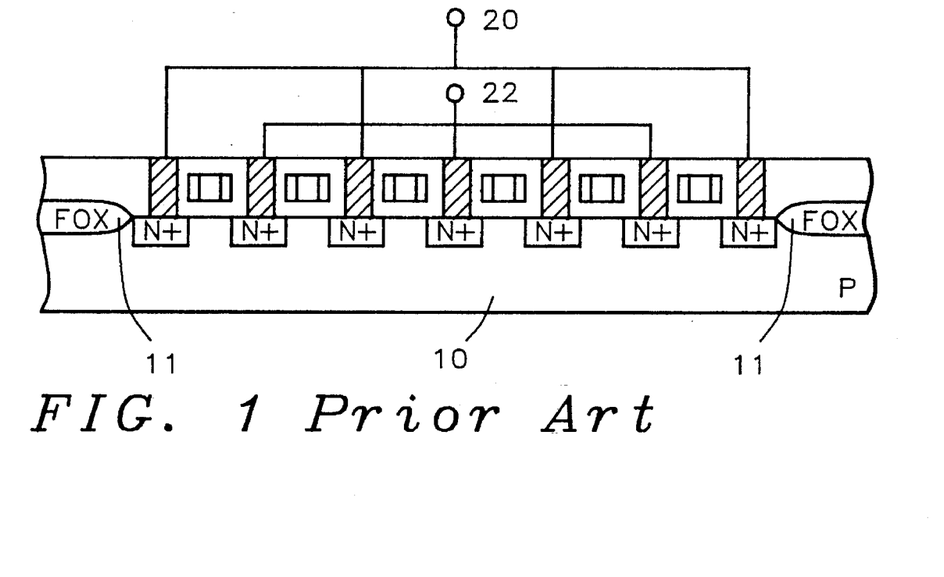
FIG. 1 is a cross-sectional representation of an integrated circuit of the prior art.

A priority in integrated circuit chip fabrication technology today is in reducing the chip size. Workers in the art have striven to reduce the width of the polysilicon from 2 µm, 1 µm, 0.8 µm, 0.5 µm, to 0.35 µm, etc. Most of the effort at reducing chip size is directed toward reducing the polysilicon size. At some point in the near future, the polysilicon width shrinkage will have reached its maximum effectiveness. Source and drain regions are planned and drawn at the chip surface, which wastes valuable underlying layout areas. The large field oxide areas are used for isolation only. For example, in FIG. 1, there is shown a portion of a partially completed integrated circuit. Field oxide regions 11 have been formed in and on the surface of the semiconductor substrate 10. Source contacts 20 and drain contacts 22 are shown in a finger-type layout on the surface of the integrated circuit chip. In order to further shrink the chip layout, the source and drain regions must be addressed.

U.S. Pat. No. 5,164,325 to Cogan et al shows the formation of a vertical channel device using a buried source/drain structure.

SUMMARY OF THE INVENTION

Accordingly, it is a primary object of the invention to provide a process for fabricating an integrated circuit device with decreased junction area.

It is another object of the present invention to provide a process for fabricating a vertical channel device integrated circuit.

In accordance with the objects of the invention, a new method of manufacturing a vertical channel device integrated circuit is described. A structure is provided comprising a semiconductor substrate having a first conductivity type, a buried source region having a second conductivity type opposite to the first conductivity type and a first dopant concentration formed on top of the semiconductor substrate, and an epitaxial layer of the second conductivity type having a second dopant concentration formed on the surface of the buried source region wherein the second dopant concentration is less than the first dopant concentration. Field oxide regions are formed in and on the surface of the epitaxial layer on the outer edges of the semiconductor substrate. A well region of first conductivity type is implanted into the epitaxial layer within the central portion of the semiconductor substrate wherein the well region defines the active area of the integrated circuit. Trenches are etched through the well region into the underlying buried source region where the well region is not covered by a mask. A first layer of silicon oxide is thermally grown conformally on the surface of the well region and within the trenches. Gate electrodes are formed by depositing a layer of polysilicon over the surface of the well region and within the trenches and etching back the polysilicon layer leaving the polysilicon layer only within the trenches. The trenches are covered with a photoresist mask. Ions of second conductivity type are implanted into the top portion of the well region not covered by the photoresist mask to form drain regions within the well region. A second layer of silicon oxide is deposited over the surface of the well region and the field oxide regions and planarized. Contact trenches are etched through the second silicon oxide layer and the field oxide regions not covered by a mask to connect to the buried source region. A second set of contact trenches are etched through portions of the second silicon oxide layer not covered by a mask to the underlying drain regions. A layer of tungsten is deposited over the surface of the substrate and within the first and second contact trenches and etched back leaving the tungsten only within the trenches. Interconnections are made between the source and drain regions to complete the fabrication of the vertical channel device in the manufacture of an integrated circuit.

According to the objects of the present invention, a new vertical channel device integrated circuit is described. The device comprises a semiconductor substrate of a first conductivity type, a buried source region having a second conductivity type opposite the first conductivity type formed on top of the semiconductor substrate, an epitaxial layer of the second conductivity type formed overlying the buried source region wherein the epitaxial layer has a dopant concentration less than the dopant concentration of the buried source region, a well region of the first conductivity type formed within the central portion of the epitaxial layer wherein the well region defines the active region of the integrated circuit, field oxide regions formed in and on the outer edges of the epitaxial layer, a top planarized layer of silicon oxide overlying the field oxide regions and the well region, polysilicon-filled trenches extending through the well region and contacting buried source region, drain regions of the second conductivity type within the top surface of the well region and between the polysilicon-filled trenches, first tungsten plug-filled trenches through the planarized silicon oxide layer contacting the drain regions, second tungsten plug-filled trenches through the field oxide regions contacting the buried source region, and interconnections between the source and drain regions.

BRIEF DESCRIPTION OF THE DRAWINGS

In the accompanying drawings forming a material part of this description, there is shown.

DESCRIPTION OF THE PREFERRED EMBODIMENTS

FIGS. 2 through 12 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

Figure 2:
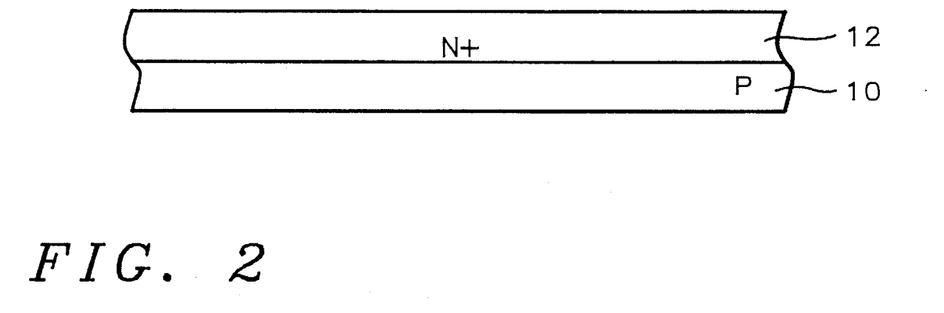
FIGS. 2 through 9 are cross-sectional representations leading up to preferred embodiments of the present invention.

Referring now more particularly to FIG. 2, there is shown a semiconductor substrate 10, preferably composed of silicon having a (100) crystallographic orientation. For this NMOS illustration, the substrate is a P-substrate or a P-well. First, the buried source region will be formed. Ions are implanted into the top surface of the semiconductor substrate to form the implanted region 12. The buried source region will be of opposite conductivity type from the substrate. For an N+ region, arsenic ions are implanted at a dosage of between about 1 E 15 to 1 E 16 atoms/cm$^2$ at an energy of between about 50 to 100 KeV. For a P+ region (not shown), BF$_2$ ions are implanted at a dosage of between about 1 E 15 to 1 E 16 atoms/cm$^2$ at an energy of between about 50 to 100 KeV.

Figure 3:
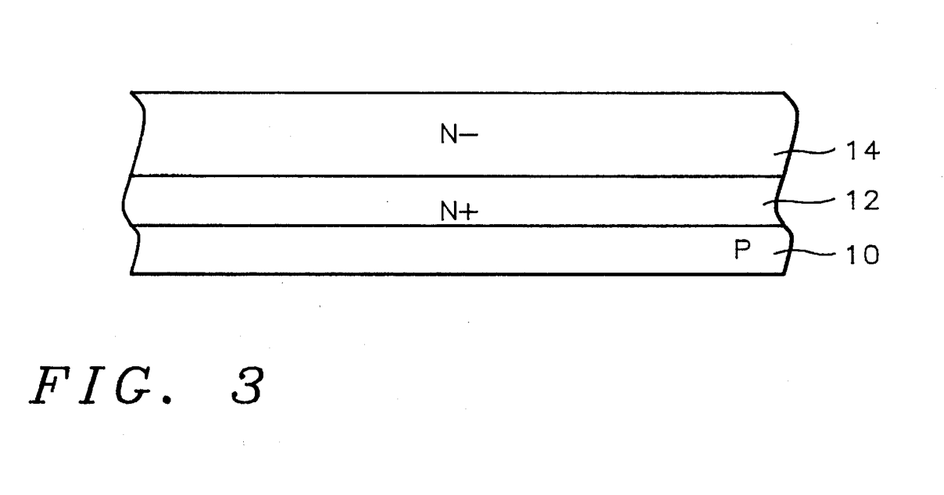

Referring now to FIG. 3, an epitaxial layer 14 is formed by, for example, subjecting the substrate to a flow of SiH$_2$Cl$_2$-H$_2$-HCl at a temperature of between about 950° to 1080° C. and a pressure of between about 40 to 60 Torr. The epitaxial layer is grown to a thickness of between about 2000 to 4000 Angstroms. The epitaxial layer has the same conductivity type as the buried source layer, but the dopant concentration of the epitaxial layer 14 is between about 1 E 11 to 1 E 12 atoms/cm$^3$, less than the dopant concentration of the buried layer which is between about 1 E 15 to 1 E 16 atoms/cm$^3$.

Figure 4:
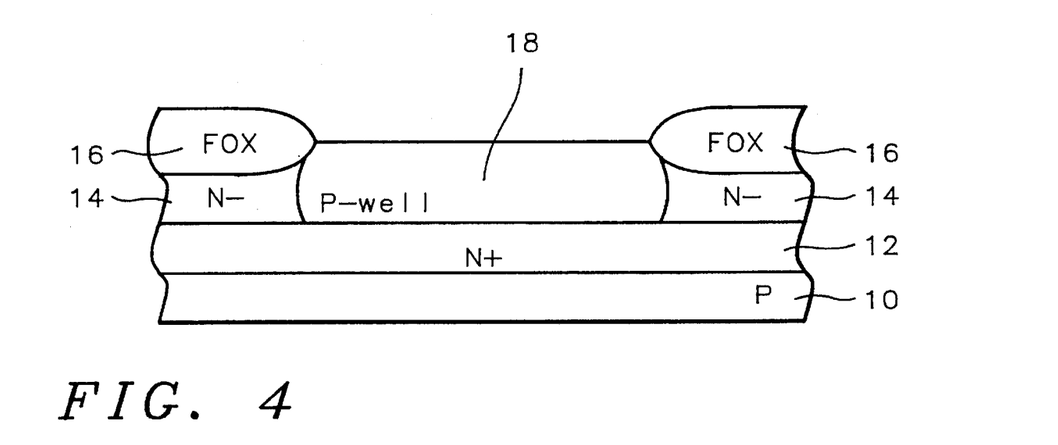

The substrate is oxidized to form field oxide isolation regions 16 on the periphery of the active area. Ions are implanted into the active area to form the well region 18, as shown in FIG. 4. The well region is of the same conductivity as the semiconductor substrate 10. For the NMOS example illustrated, the well region is a P-well, formed by implanting boron ions at a dosage of between about 5 E 12 to 5 E 13 atoms/cm$^2$ and an energy of between about 100 to 200 KeV. An N-well, not shown, would be formed by implanting phosphorus ions at a dosage of between about 1 E 12 to 1 E 13 atoms/cm$^2$ and an energy of between about 100 to 200 KeV.

Figure 5:
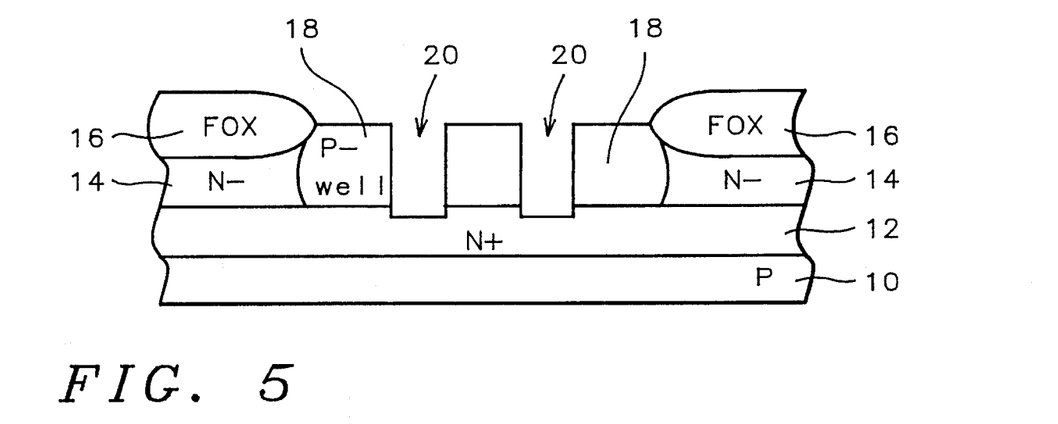

Referring now to FIG. 5, silicon trenches 20 are etched through the well region 18 and into the buried source region 12, using a conventional reactive ion etching ambient.

Figure 6:
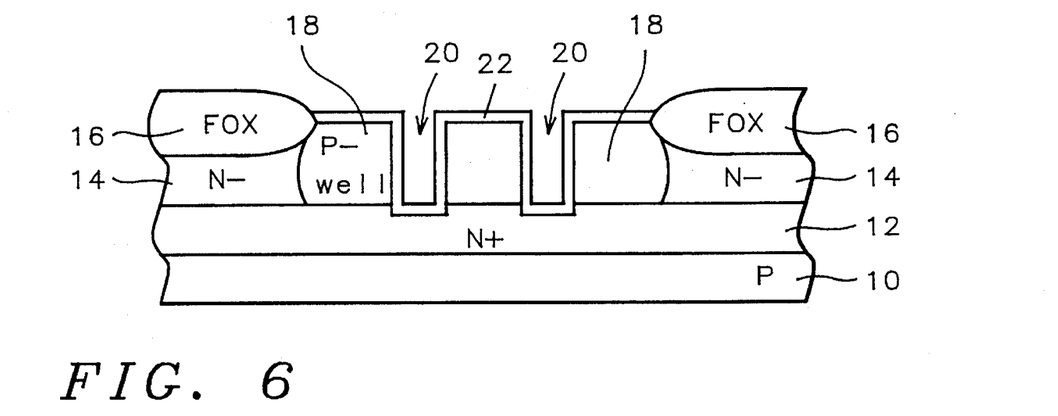
Figure 7:
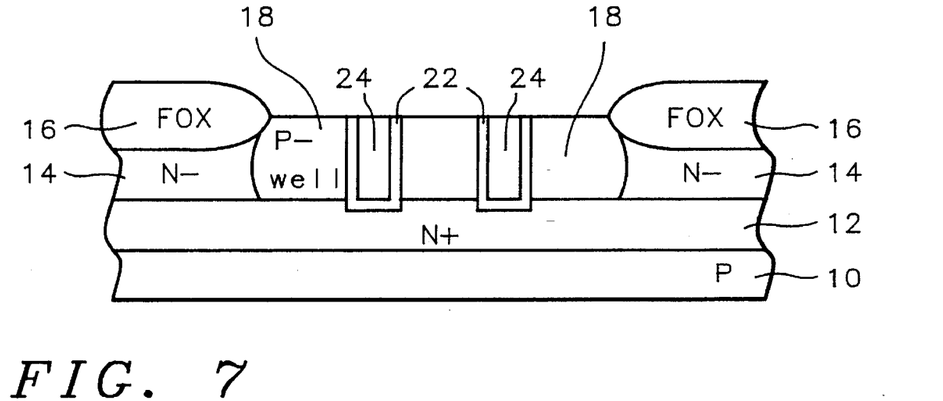

A gate oxide layer 22 is thermally grown conformally on the surface of the well region 18 and within the trenches 20, as illustrated in FIG. 6. A layer of polysilicon is deposited by chemical vapor deposition (CVD) over the surface of the gate oxide layer 22 and within the trenches. The polysilicon is doped as is conventional to form polysilicon gate electrodes 24. The polysilicon and gate oxide layer are etched back leaving the polysilicon only within the trenches as shown in FIG. 7.

Figure 8:
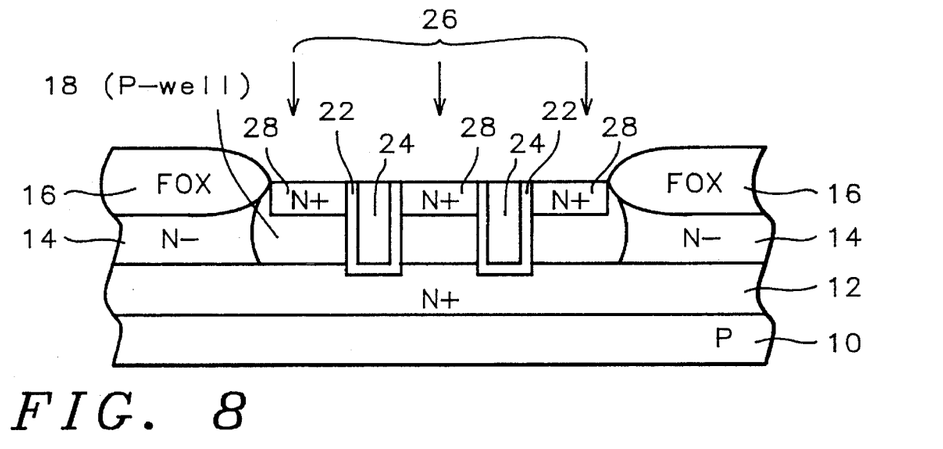

Referring now to FIG. 8, drain regions 28 are formed within the top surface of the well region between the polysilicon gate electrodes. Lithographic masks, not shown, may be required to protect the areas, such as the gate electrodes, not to be subjected to the ion implantation. The formation of the lithographic masks is done by conventional lithography and etching techniques. For the N+ drain implant of the example, arsenic ions 26 are implanted at a dosage of between about 1 E 15 to 1 E 16 atoms/cm$^2$ and energy of between about 50 to 100 KeV. For a P+ drain implantation, not shown, BF$_2$ ions are implanted at a dosage of between about 1 E 15 to 1 E 16 atoms/cm$^2$ and energy of between about 50 to 100 KeV.

Figure 9:
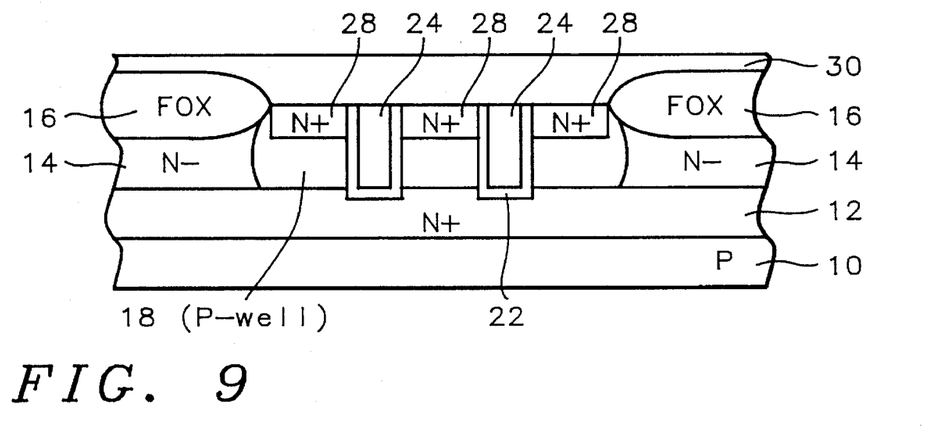

Referring now to FIG. 9, a layer of silicon dioxide 30 is deposited by CVD over the surface of the substrate and planarized. The connection to the buried source region will now be described. Two alternative methods may be used to accomplish the connection. The first method is illustrated by FIGS. 10A and 10B.

Figure 10A:
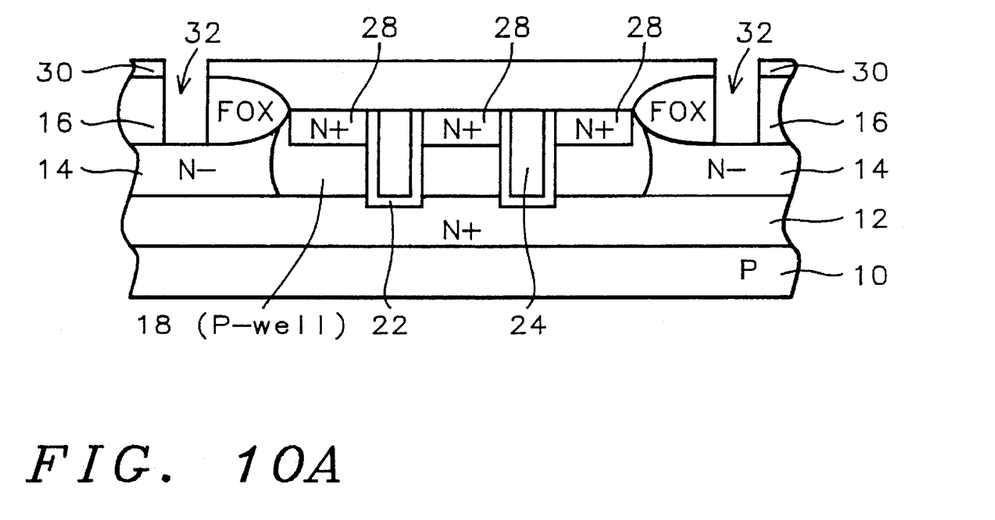
FIGS. 10A, 10B and 11 are cross-sectional representations of a first preferred embodiment of the present invention.
Figure 10B:
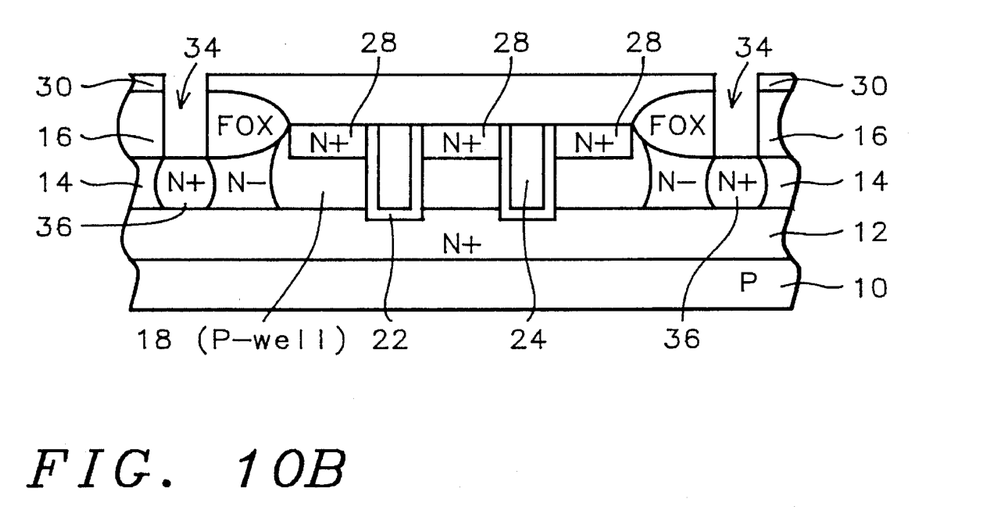

Referring now to FIG. 10A, trenches 32 are etched through the field oxide regions 16 to the underlying epitaxial layer 14. Referring to FIG. 10B, ions 34 are implanted through the trenches 32 into the epitaxial layer to form heavily doped region 36 of the same dopant concentration as the underlying buried source region. The implant then is driven in to provide connection to the buried source region. For the NMOS example illustrated, phosphorus ions are implanted with a dosage of between about 5 E 15 to 5 E 16 atoms/cm$^2$ and energy of between about 100 to 200 KeV. For a PMOS integrated circuit device, not shown, BF$_2$ ions are implanted with a dosage of between about 5 E 15 to 5 E 16 atoms/cm$^2$ and energy of between about 100 to 200 KeV.

Figure 10C:
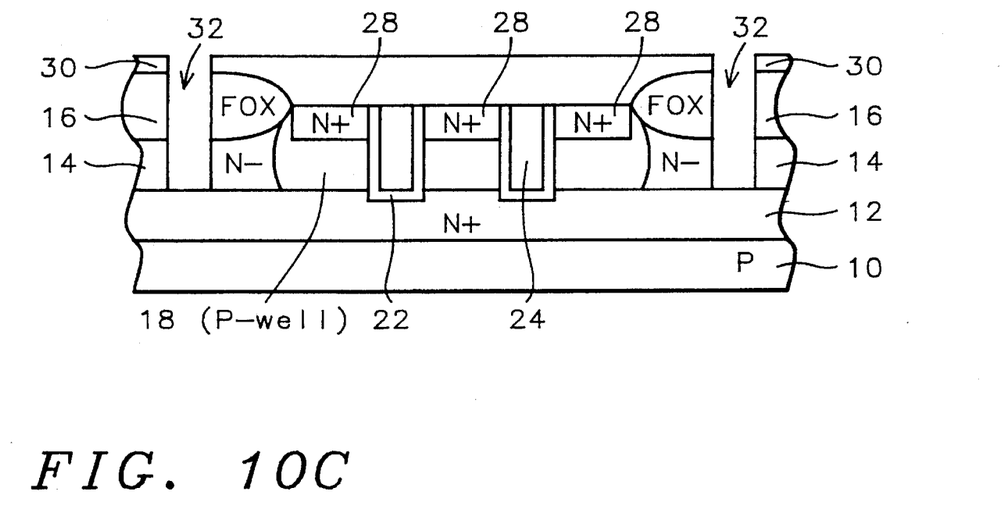
FIG. 10C is a cross-sectional representation of a second preferred embodiment of the present invention.

Alternatively, as illustrated in FIG. 10C, trenches 32 are etched through the field oxide regions 16 and the underlying epitaxial layer 14 to the buried source region 12. With this alternative, the trench makes a direct connection to the buried source region so that an additional implant is unnecessary. The first alternative is illustrated in the remaining figures, although processing is the same for both alternatives.

Figure 11:
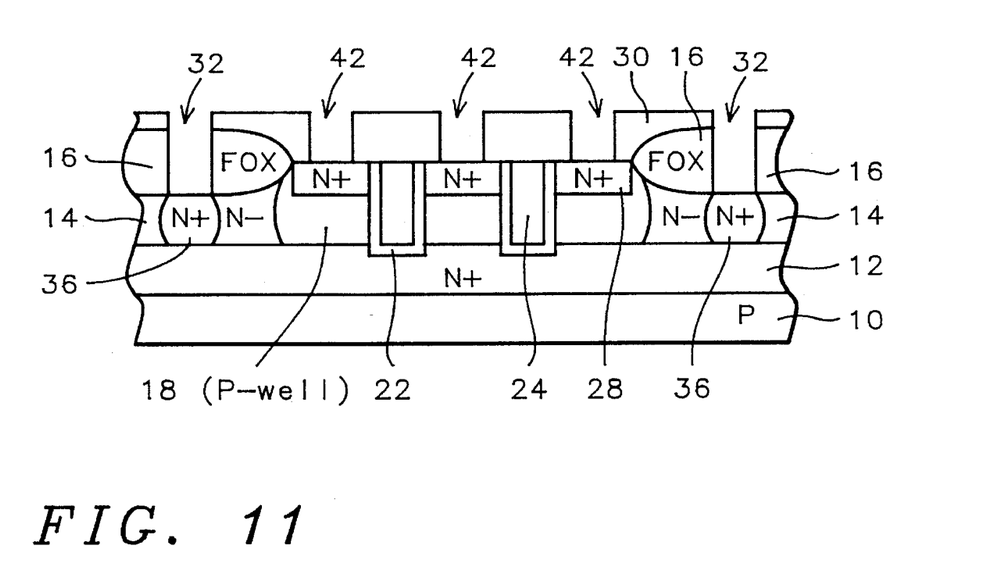

Referring now to FIG. 11, connection to the drain regions is now made. The source and drain contact etching must be performed with separate etching masks because of the differing depths of the contacts. Trenches 42 are etched through the silicon dioxide layer 30 to the drain regions 28.

Figure 12A:
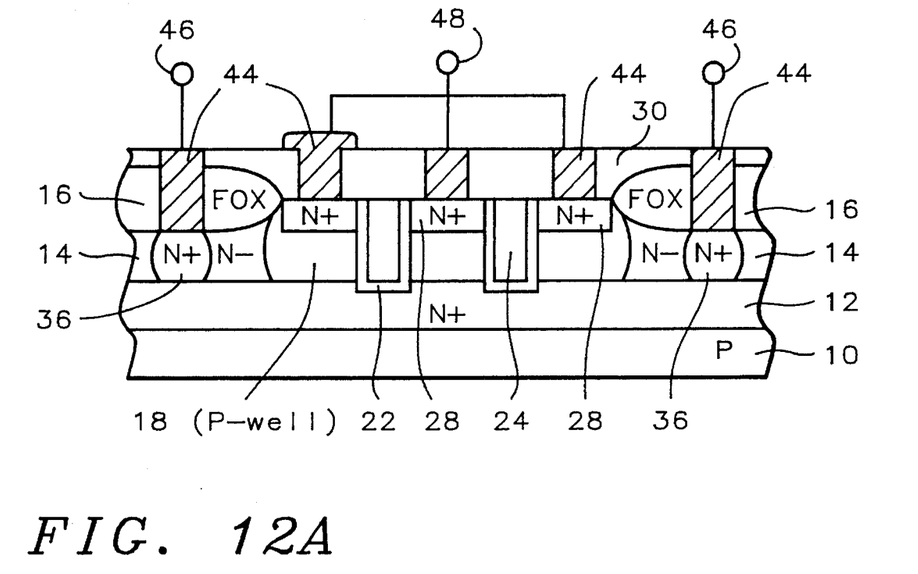
FIG. 12A is a cross-section representation of a completed integrated circuit according to the first preferred embodiment of the present invention.
Figure 12B:
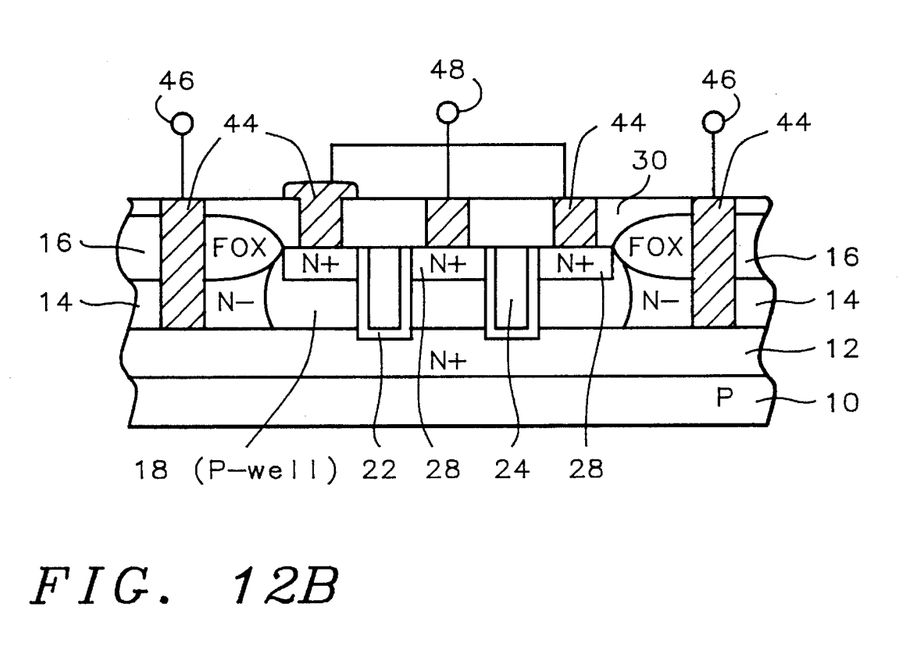
FIG. 12B is a cross-section representation of a completed integrated circuit according to the second preferred embodiment of the present invention.

Selective tungsten CVD deposition 44 and etchback is used to fill the trenches 32 and 42 to complete the source and drain contacts, as shown in FIG. 12A in the first alternative and FIG. 12B in the second alternative. Interconnections 46 and 48 are formed between the source and drain regions, respectively, to complete formation of the vertical channel device integrated circuit.

The device formed by the method of the present invention employs vertical channels and buried source junction. Source contacts are planned at the surface of the field oxide regions so as to reduce the size of the active area. This results in nearly a 30% decrease in layout and chip size.

The vertical channel device integrated circuit of the present invention illustrated in FIGS. 12A and 12B comprises a semiconductor substrate 10 of a first conductivity type, a buried source region 12 having a second conductivity type opposite the first conductivity type formed on top of the semiconductor substrate, an epitaxial layer 14 of the second conductivity type formed overlying the buried source region wherein the epitaxial layer has a dopant concentration less than the dopant concentration of the buried source region, a well region 18 of the first conductivity type formed within the central portion of the epitaxial layer wherein the well region defines the active region of the integrated circuit, field oxide regions 16 formed in and on the outer edges of the epitaxial layer, a top planarized layer 30 of silicon oxide overlying the field oxide regions and the well region, polysilicon-filled trenches 24 extending through the well region and contacting buried source region 12, drain regions 28 of the second conductivity type within the top surface of the well region and between the polysilicon-filled trenches, first tungsten plug-filled trenches 44 through the planarized silicon oxide layer contacting the drain regions 28, second tungsten plug-filled trenches 44 through the field oxide regions 16 contacting the buried source region 12, and interconnections 46 and 48 between the source and drain regions.

FIG. 12A illustrates the first alternative connection to the buried source region as described with reference to FIGS. 10A and 10B. Tungsten plug-filled trenches 44 extend to the epitaxial layer 14. Heavily-doped region 36 has the same dopant concentration as the underlying buried source region 12 and hence provides connection to the buried source region.

FIG. 12B illustrates the second alternative connection to the buried source region 12 as described with respect to FIG. 10C. The tungsten plug-filled trenches 44 extend through the field oxide regions 16 and the underlying epitaxial layer 14 to the buried source region 12. With this alternative, the tungsten plug 44 makes a direct connection to the buried source region 12.

While the invention has been particularly shown and described with reference to the preferred embodiments thereof, it will be understood by those skilled in the art that various changes in form and details may be made without departing from the spirit and scope of the invention.

What is claimed is:

1. The method of manufacturing a vertical channel device comprising:

providing a structure comprising a semiconductor substrate having a first conductivity type, a buried source region having a second conductivity type opposite to said first conductivity type and a first dopant concentration formed on top of said semiconductor substrate, and an epitaxial layer of said second conductivity type having a second dopant concentration formed on the surface of said buried source region wherein the second dopant concentration is less than the first dopant concentration;

forming field oxide regions in and on the surface of said epitaxial layer;

implanting to form a well region of said first conductivity type into said epitaxial layer between said field oxide regions wherein said well region defines an active area of said vertical channel device;

etching through said well region into the underlying buried source region where said well region is not covered by a mask leaving trenches within said active region;

thermally growing a first layer of silicon oxide conformally on the surface of said well region and within said trenches;

forming a gate electrode by depositing a layer of polysilicon over the surface of said well region and within said trenches and etching back said polysilicon layer leaving said polysilicon layer only within said trenches;

covering said trenches with a photoresist mask;

implanting ions of said second conductivity type into the top portion of said well region not covered by said photoresist mask to form drain regions within said well region and between said trenches;

depositing a second layer of silicon oxide over the surface of said well region and said field oxide regions and planarizing said second silicon oxide layer;

etching through a portion of said second silicon oxide layer and underlying field oxide regions not covered by a mask to the underlying epitaxial layer to connect to said buried source region leaving first contact trenches through said second silicon oxide layer and said field oxide regions;

etching through portions of said second silicon oxide layer not covered by a mask to the underlying drain regions leaving second contact trenches through said second silicon oxide layer;

depositing tungsten within said first and second contact trenches; and interconnecting said source and drain regions to complete the fabrication of said vertical channel device.

2. The method of claim 1 wherein said vertical channel device is an NMOS device and wherein said first conductivity type is P and said second conductivity type is N.

3. The method of claim 1 wherein said vertical channel device is a PMOS device and wherein said first conductivity type is N and said second conductivity type is P.

4. The method of claim 2 wherein said buried source region is formed by implanting arsenic ions with a dosage of between about $1 \text{ E } 15$ to $1 \text{ E } 16$ atoms/cm$^2$ and an energy of between about 50 to 100 KeV.

5. The method of claim 3 wherein said buried source region is formed by implanting $BF_2$ ions with a dosage of between about $1 \text{ E } 15$ to $1 \text{ E } 16$ atoms/cm2 and an energy of between about 50 to 100 KeV.

6. The method of claim 1 wherein said epitaxial layer is formed to a thickness of between about 2000 to 4000 Angstroms.

7. The method of claim 2 wherein said well region is a P-well formed by implanting boron ions at a dosage of between about $5 \text{ E } 12$ to $5 \text{ E } 13$ atoms/cm$^2$ and an energy of between about 100 to 200 KeV.

8. The method of claim 3 wherein said well region is an N-well formed by implanting phosphorus ions at a dosage of between about $1 \text{ E } 12$ to $1 \text{ E } 13$ atoms/cm$^2$ and an energy of between about 100 to 200 KeV.

9. The method of claim 2 wherein said drain regions are formed by implanting arsenic ions at a dosage of between about $1 \text{ E } 15$ to $1 \text{ E } 16$ atoms/cm$^2$ and an energy of between about 50 to 100 KeV.

10. The method of claim 3 wherein said drain regions are formed by implanting $BF_2$ ions at a dosage of between about $1 \text{ E } 15$ to $1 \text{ E } 16$ atoms/cm$^2$ and an energy of between about 50 to 100 KeV.

11. The method of claim 1 wherein said first contact trenches for connection to said buried source region extend through said field oxide regions and the underlying epitaxial layer to said buried source region.

12. The method of claim 1 wherein said first contact trenches for connection to said buried source region extend through said field oxide regions to the underlying epitaxial layer and wherein an implant of the same conductivity type as said buried source region is made through said first contact trenches and driven in to contact said buried source region.

13. The method of claim 12 wherein said second conductivity type is N and wherein said implant of the same conductivity type comprises phosphorus ions implanted at a dosage of between about $5 \text{ E } 15$ to $5 \text{ E } 16$ atoms/cm$^2$ and an energy of between about 100 to 200 KeV.

14. The method of claim 12 wherein said second conductivity type is P and wherein said implant of the same conductivity type comprises $BF_2$ ions implanted at a dosage of between about 5 E 15 to 5 E 16 atoms/cm² and an energy of between about 100 to 200 KeV.

15. The method of manufacturing a vertical channel device comprising:

implanting ions into a semiconductor substrate having a first conductivity type to provide a buried source region having a second conductivity type opposite to said first conductivity type and having a first dopant concentration;

forming an epitaxial layer of said second conductivity type having a dopant concentration on the surface of said buried source region wherein the dopant concentration of said epitaxial layer is less than the first dopant concentration;

forming field oxide regions in and on the surface of said epitaxial layer;

implanting to form a well region of said first conductivity type into said epitaxial layer between said field oxide regions wherein said well region defines an active area of said vertical channel device;

etching through said well region into the underlying buried source region where said well region is not covered by a mask leaving trenches within said active region;

thermally growing a first layer of silicon oxide conformally on the surface of said well region and within said trenches;

depositing a layer of polysilicon over the surface of said well region and within said trenches and etching back said polysilicon layer leaving said polysilicon layer only within said trenches;

covering said trenches with a photoresist mask;

implanting ions of said second conductivity type into the top portion of said well region not covered by said photoresist mask to form drain regions within said well region and between said trenches;

depositing a second layer of silicon oxide over the surface of said well region and said field oxide regions and planarizing said second silicon oxide layer;

etching through a portion of said second silicon oxide layer and underlying field oxide regions not covered by a mask to the underlying epitaxial layer to connect to said buried source region leaving first contact trenches through said second silicon oxide layer and said field oxide regions;

etching through portions of said second silicon oxide layer not covered by a mask to the underlying drain regions second contact trenches through said second silicon oxide layer;

depositing tungsten within said first and second contact trenches; and interconnecting said source and drain regions to complete the fabrication of said vertical channel device.

16. The method of claim 15 wherein said vertical channel device is an NMOS device and wherein said first conductivity type is P and said second conductivity type is N.

17. The method of claim 15 wherein said vertical channel device is a PMOS device and wherein said first conductivity type is N and said second conductivity type is P.

18. The method of claim 16 wherein said buried source region is formed by implanting arsenic ions with a dosage of between about 1 E 15 to 1 E 16 atoms/cm² and an energy of between about 50 to 100 KeV.

19. The method of claim 17 wherein said buried source region is formed by implanting BF₂ ions with a dosage of between about 1 E 15 to 1 E 16 atoms/cm² and an energy of between about 50 to 100 KeV.

20. The method of claim 15 wherein said epitaxial layer has a thickness of between about 2000 to 4000 Angstroms.

21. The method of claim 16 wherein said well region is a P-well formed by implanting boron ions at a dosage of between about 5 E 12 to 5 E 13 atoms/cm² and an energy of between about 100 to 200 KeV.

22. The method of claim 17 wherein said well region is an N-well formed by implanting phosphorus ions at a dosage of between about 1 E 12 to 1 E 13 atoms/cm² and an energy of between about 100 to 200 KeV.

23. The method of claim 16 wherein said drain regions are formed by implanting arsenic ions at a dosage of between about 1 E 15 to 1 E 16 atoms/cm² and an energy of between about 50 to 100 KeV.

24. The method of claim 17 wherein said drain regions are formed by implanting BF₂ ions at a dosage of between about 1 E 15 to 1 E 16 atoms/cm² and an energy of between about 50 to 100 KeV.

25. The method of claim 15 wherein said first contact trenches extend through said field oxide regions and the underlying epitaxial layer to said buried source region.

26. The method of claim 15 wherein said first contact trenches extend through said field oxide regions to the underlying epitaxial layer and wherein an implant of the same conductivity type as said buried source region is made through said first contact trenches and driven in to contact said buried source region.

27. The method of claim 26 wherein said second conductivity type is N and wherein said implant of the same conductivity type comprises phosphorus ions implanted at a dosage of between about 5 E 15 to 5 E 16 atoms/cm² and an energy of between about 100 to 200 KeV.

28. The method of claim 26 wherein said second conductivity type is P and wherein said implant of the same conductivity type comprises BF₂ ions implanted at a dosage of between about 5 E 15 to 5 E 16 atoms/cm² and an energy of between about 100 to 200 KeV.

29. The method of manufacturing an NMOS vertical channel device comprising:

providing a structure comprising a P-type semiconductor substrate, an N+ buried source region formed on top of said semiconductor substrate, and an N-epitaxial layer formed on the surface of said N+ buried source region;

forming field oxide regions in and on the surface of said epitaxial layer;

implanting to form a P-well into said epitaxial layer between said field oxide regions wherein said P-well defines an active area of said vertical channel device;

etching through said P-well into the underlying N+ buried source region where said P-well is not covered by a mask leaving trenches within said active region;

thermally growing a first layer of silicon oxide conformally on the surface of said P-well and within said trenches;

forming a gate electrode by depositing a layer of polysilicon over the surface of said P-well and within said trenches and etching back said polysilicon layer leaving said polysilicon layer only within said trenches;

covering said trenches with a photoresist mask;

implanting N+ ions into the top portion of said P-well not covered by said photoresist mask to form drain regions within said P-well;

depositing a second layer of silicon oxide over the surface of said P-well and said field oxide regions and planarizing said second silicon oxide layer;

etching through a portion of said second silicon oxide layer and underlying field oxide regions not covered by a mask to the underlying epitaxial layer to connect to said N+ buried source region leaving first contact trenches through said second silicon oxide layer and said field oxide regions;

etching through portions of said second silicon oxide layer not covered by a mask to the underlying drain regions leaving second contact trenches through said second silicon oxide layer;

depositing tungsten within said first and second contact trenches; and interconnecting said source and drain regions to complete the fabrication of said NMOS vertical channel device.

30. The method of claim 29 wherein said N+ buried source region is formed by implanting arsenic ions with a dosage of between about 1 E 15 to 1 E 16 atoms/cm$^2$ and an energy of between about 50 to 100 KeV.

31. The method of claim 29 wherein said epitaxial layer has a thickness of between about 2000 to 4000 Angstroms.

32. The method of claim 29 wherein said P-well is formed by implanting boron ions at a dosage of between about 5 E 12 to 5 E 13 atoms/cm$^2$ and an energy of between about 100 to 200 KeV.

33. The method of claim 29 wherein said drain regions are formed by implanting arsenic ions at a dosage of between about 1 E 15 to 1 E 16 atoms/cm$^2$ and an energy of between about 50 to 100 KeV.

34. The method of claim 29 wherein said first contact trenches extend through said field oxide regions and the underlying epitaxial layer to said N+ buried source region.

35. The method of claim 29 wherein said first contact trenches extend through said field oxide regions to the underlying epitaxial layer and wherein an N+ implant is made through said first contact trenches and driven in to contact said N+ buried source region.

36. The method of claim 35 wherein said N+ implant comprises phosphorus ions implanted at a dosage of between about 5 E 15 to 5 E 16 atoms/cm$^2$ and an energy of between about 100 to 200 KeV.

37. The method of manufacturing a PMOS vertical channel device comprising:

providing a structure comprising an N-type semiconductor substrate, a P+ buried source region formed on top of said semiconductor substrate, and a P-epitaxial layer formed on the surface of said P+ buried source region;

forming field oxide regions in and on the surface of said epitaxial layer;

implanting to form an N-well into said epitaxial layer between said field oxide regions wherein said N-well defines an active area of said vertical channel device;

etching through said N-well into the underlying N+ buried source region where said N-well is not covered by a mask leaving trenches within said active region;

thermally growing a first layer of silicon oxide conformally on the surface of said N-well and within said trenches;

forming a gate electrode by depositing a layer of polysilicon over the surface of said N-well and within said trenches and etching back said polysilicon layer leaving said polysilicon layer only within said trenches;

covering said trenches with a photoresist mask;

implanting P+ ions into the top portion of said N-well not covered by said photoresist mask to form drain regions within said N-well;

depositing a second layer of silicon oxide over the surface of said N-well and said field oxide regions and planarizing said second silicon oxide layer;

etching through a portion of said second silicon oxide layer and underlying field oxide regions not covered by a mask to the underlying epitaxial layer to connect to said P+ buried source region leaving first contact trenches through said second silicon oxide layer and said field oxide regions;

etching through portions of said second silicon oxide layer not covered by a mask to the underlying drain regions leaving second contact trenches through said second silicon oxide layer;

depositing tungsten within said first and second contact trenches; and interconnecting said source and drain regions to complete the fabrication of said PMOS vertical channel device.

38. The method of claim 37 wherein said P+ buried source region is formed by implanting $BF_2$ ions with a dosage of between about 1 E 15 to 1 E 16 atoms/cm$^2$ and an energy of between about 50 to 100 KeV.

39. The method of claim 37 wherein said epitaxial layer has a thickness of between about 2000 to 4000 Angstroms.

40. The method of claim 37 wherein said N-well is formed by implanting phosphorus ions at a dosage of between about 1 E 12 to 1 E 13 atoms/cm$^2$ and an energy of between about 100 to 200 KeV.

41. The method of claim 37 wherein said drain regions are formed by implanting $BF_2$ ions at a dosage of between about 1 E 15 to 1 E 16 atoms/cm$^2$ and an energy of between about 50 to 100 KeV.

42. The method of claim 37 wherein said first contact trenches extend through said field oxide regions and the underlying epitaxial layer to said P+ buried source region.

43. The method of claim 37 wherein said first contact trenches extend through said field oxide regions to the underlying epitaxial layer and wherein a P+ implant is made through said first contact trenches and driven in to contact said P+ buried source region.

44. The method of claim 43 wherein said P+ implant comprises $BF_2$ ions implanted at a dosage of between about 5 E 15 to 5 E 16 atoms/cm$^2$ and an energy of between about 100 to 200 KeV.

* * * * *